(12) United States Patent
Kumamoto et al.

(10) Patent No.: US 8,476,161 B2
(45) Date of Patent: Jul. 2, 2013

(54) METHOD FOR FORMING CU ELECTRICAL INTERCONNECTION FILM

(75) Inventors: Shoichiro Kumamoto, Shizuoka (JP); Masamichi Harada, Shizuoka (JP); Harunori Ushikawa, Shizuoka (JP)

(73) Assignee: Ulvac, Inc., Chigasaki (JP)

( * ) Notice: Subject to any disclaimer, the term of this patent is extended or adjusted under 35 U.S.C. 154(b) by 0 days.

(21) Appl. No.: 12/935,746

(22) PCT Filed: Jul. 14, 2009

(86) PCT No.: PCT/JP2009/062745
§ 371 (c)(1), (2), (4) Date: Sep. 30, 2010

(87) PCT Pub. No.: WO2010/007991
PCT Pub. Date: Jan. 21, 2010

(65) Prior Publication Data
US 2011/0104890 A1  May 5, 2011

(30) Foreign Application Priority Data
Jul. 18, 2008 (JP) .................................. 2008-187816

(51) Int. Cl.
*H01L 21/768* (2006.01)
*C23C 16/04* (2006.01)
*C23C 16/18* (2006.01)

(52) U.S. Cl.
CPC .............. *C23C 16/045* (2013.01); *C23C 16/18* (2013.01); *H01L 21/76846* (2013.01); *H01L 21/76873* (2013.01); *H01L 21/76876* (2013.01); *H01L 21/76877* (2013.01); *H01L 21/76882* (2013.01)
USPC ............ 438/653; 438/660; 438/680; 438/687

(58) Field of Classification Search
USPC ................. 438/643, 648, 678, 653, 660, 680, 438/687; 257/E21.295
See application file for complete search history.

(56) References Cited

U.S. PATENT DOCUMENTS
6,891,269 B1 * 5/2005 Okamoto ...................... 257/753
2004/0248397 A1 * 12/2004 Seo et al. ...................... 438/627
(Continued)

FOREIGN PATENT DOCUMENTS
EP  1164637 A2  12/2001
JP  2002-110679 A  4/2002
(Continued)

OTHER PUBLICATIONS

Hoon Kim et al., Material Consideration on Ta, Mo, Ru, and Os as Glue Layer for Ultra Large Scale Integration Cu Interconnects, Japanese Journal of Applied Physics, 2006, pp. 2497-2501, vol. 45, No. 4A.

(Continued)

*Primary Examiner* — Olik Chaudhuri
*Assistant Examiner* — Wilner Jean Baptiste
(74) *Attorney, Agent, or Firm* — Arent Fox LLP (57) ABSTRACT

Provided is a Cu electrical interconnection film forming method, wherein an adhesive layer (base film) having improved adhesiveness with a Cu electrical interconnection film is used, in a semiconductor device manufacturing process. After forming a barrier film on a substrate whereupon a hole or the like is formed, a PVD-Co film or a CVD-Co film or an ALD-Co film is formed on the barrier film. Then, after filling up or burying the hole or the like, which has the Co film formed on the surface, with a CVD-Cu film or a PVD-Cu film, heat treatment is performed at a temperature of 350° C. or below, and the Cu electrical interconnection film is formed.

10 Claims, 5 Drawing Sheets

U.S. PATENT DOCUMENTS

| | | | |
|---|---|---|---|
| 2009/0130843 A1* | 5/2009 | Suzuki | 438/653 |
| 2010/0075498 A1* | 3/2010 | Takagi et al. | 438/678 |
| 2010/0092696 A1* | 4/2010 | Shinriki et al. | 427/576 |

FOREIGN PATENT DOCUMENTS

| | | |
|---|---|---|
| JP | 2003-051538 | 2/2003 |
| JP | 2007-123853 A | 5/2007 |
| JP | 2007-243187 A | 9/2007 |
| JP | 2008-098449 | 4/2008 |
| WO | WO 2007/091339 A1 | 8/2007 |

OTHER PUBLICATIONS

Official Action of corresponding Japanese patent application issued Apr. 10, 2013.

Official Action in corresponding Taiwanese Patent Application issued Jan. 28, 2013.

* cited by examiner

Non-Adhesion Interface　　　　Adhesion Interface

Cu Diffusion (a-2)　　　　　　　　　　(b-2)

A

Immediately After　　　　Heat-Treatment at
Film-Formation　　　　　350°C for 10 Minutes

METHOD FOR FORMING CU ELECTRICAL INTERCONNECTION FILM

CROSS-REFERENCED TO RELATED APPLICATION

This application is a National Stage entry of International Application No. PCT/JP2009/062745, filed Jul. 14, 2009, which claims priority to Japanese Patent Application 2008-187816, filed Jul. 18, 2008. The disclosure of the prior application is hereby incorporated in its entirety by reference.

TECHNICAL FIELD

The present invention relates to a method for forming a Cu electrical interconnection film or a Cu wiring film and more a particularly to a Cu electrical interconnection film forming method used in a semiconductor device-manufacturing process, wherein the method comprises the steps of forming a base film having improved adhesion between a barrier layer and a Cu electrical interconnection film subsequently applied thereto, while making use of a Co film and a barrier film which are in the form of a laminate, as an adhesive layer and then forming the Cu electrical interconnection film.

BACKGROUND ART

The existing Cu electrical interconnection film-forming process comprises, for instance, the step of forming a PVD-barrier film (such as PVD-Ti film or PVD-Ta film) and a PVD-seed film (PVD-Cu film) according to the consistent vacuum process (in-situ process) and the process also comprises, as subsequent steps, a Cu-plating step and a CMP step. However, the unsymmetrical properties, at the wafer edges, and the extent of the overhang of the PVD film thus formed increasingly become conspicuous on and after the generation in which the device node is on the order of 32 nm, due to the micronization of the size of the recent electrical interconnections or distributing wirings and as a result, a problem arises such that voids are formed during the plating step.

In this respect, the term "PVD-barrier film" used herein means a barrier film formed according to the PVD technique, while the term "PVD-seed film" herein used refers to a seed film prepared according to the PVD technique. The terms "PVD (CVD)-Cu film", "ALD-barrier film" and "PVD (CVD, ALD)-Co film as used herein and appearing in the following description refer to films prepared according to the PVD, CVD and ALD techniques, respectively.

Figure 1:
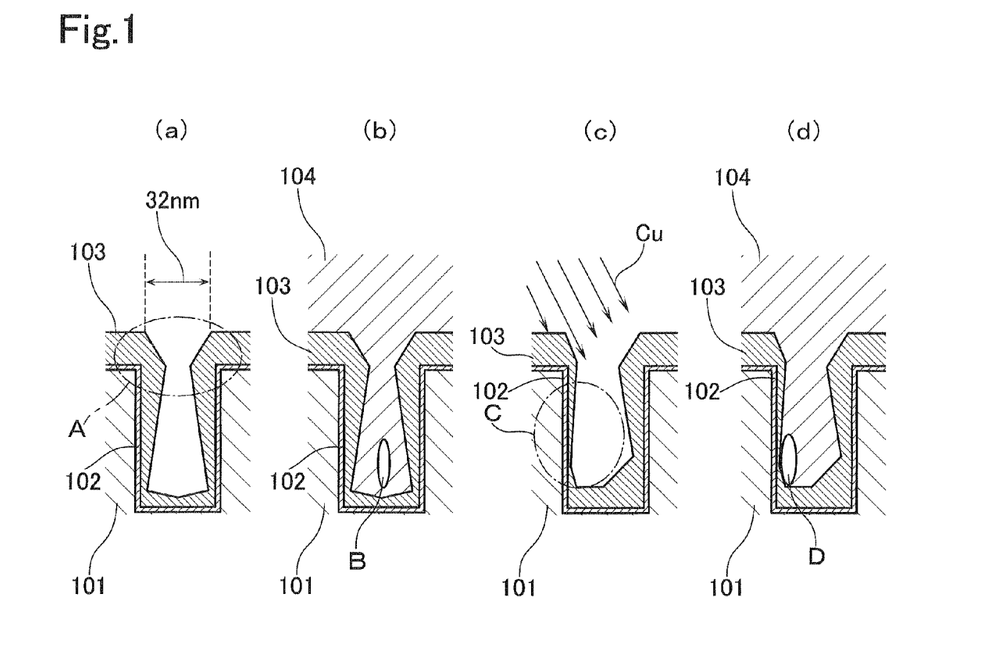
FIG. 1 is a schematic diagram illustrating the generation of voids in holes, in the case of the conventional technique and more specifically.

As shown in, for instance, FIGS. 1(a) and 1(b), if forming a PVD-seed film 103 (PVD-Cu film) on a barrier film 102 which has been applied onto the surface of a substrate 101 provided thereon with holes each having a diameter ($\phi$) of 32 nm and trenches, the so-called overhang (the portion indicated by A) is caused at the upper portions of the holes and trenches and this in turn makes the openings of the holes or the like narrower. Then the interior of, for instance, the holes are filled up or buried with a Cu film 104 by the plating step, but various problems arise such that the presence of the foregoing overhang would prevent the easy introduction of a plating liquid into the interior thereof and that as the holes or the like is filled up or buried with the Cu film, the Cu film present therein is sucked up because of the insufficient adhesion between the Cu film and the barrier film and this correspondingly results in the formation of voids (the portion indicated by B) within the film. Moreover, as shown in FIGS. 1(c) and 1(d), a PVD-seed film 103 cannot be formed uniformly and symmetrically on the side face of, for instance, the holes (the portion indicated by C). This accordingly becomes a cause of a further problem such that voids (the portion indicated by D) would be generated in the Cu film 104 as will be formed during the subsequent plating step for filling up or burying the holes or the like, because of the foregoing unsymmetrical properties of the barrier film.

The barrier film formed according to the ALD technique or the CVD technique and the CVD-Cu film are free of any unsymmetricalness and they are not accompanied by overhanging and accordingly, it has been tried to form a Cu electrical interconnection film by a method which makes use of these two processes. In this case, however, the method suffers from a problem such that voids are formed in the resulting Cu film because of the insufficient adhesion between the CVD-Cu film and the ALD-barrier film as a base film. For this reason, such a method has not yet been put into practical use.

As shown in, for instance, FIGS. 2(a) and 2(b), when forming a TiN barrier film 202 according to the ALD technique (ALD-TiN barrier film) within the holes or trenches formed on a substrate 201 and then filling up or burying the interior thereof with a CVD-Cu film 203, voids (the portion indicated by the symbol A) are generated within the resulting Cu film. In this connection, FIG. 2(a) is an SEM micrograph showing the cross section of a substrate in which the holes or the like are filled up or buried with a CVD-Cu film 203, while FIG. 2(b) is a schematic diagram showing the same.

There have conventionally been proposed, as an adhesive layer used when forming a Cu-electrical interconnection film, films of Ti, Ru, Ru/Ti alloy, Cu/Ti alloy and Ru/Cu alloy prepared according to the CVD or ALD technique, and films of Ti, Ru, Ti/Ru alloy, Cu, Cu/Ti alloy and Cu/Ru alloy prepared according to the PVD technique (see, for instance, Non-Patent Document 1 specified below). In this respect, the production cost should be reduced as low as possible in the line for the mass production of semiconductor devices, but Ru as a rare metal is considerably expensive (next to gold and platinum) and therefore, the use thereof would increase the unit cost of producing the same. Thus, the use of such a metal is not suitable for the mass production. In addition, the use of Ti is not always acceptable since it does not necessarily have satisfied adhesive properties.

For this reason, there has been desired for the development of an adhesive film which can ensure the desired adhesion between the barrier film and the CVD-Cu film or PVD-Cu film and which can likewise ensure the merit of reducing the production cost, but there has not yet been developed any such a satisfactory adhesive layer.

PRIOR ART DOCUMENT

Non-Patent Document:
Non-Patent Document 1: Japanese Journal of Applied Physics, 2006, Vol. 45, No. 4A, pp. 2497-2501 (Abstract or the like).

SUMMARY OF THE INVENTION

Problems that the Invention is to Solve

It is an object of the present invention to provide a Cu electrical interconnection film-forming method which can be used in the semiconductor device-manufacturing process and which relies on the use of an adhesive layer (a base film) for the improvement of the adhesion between the barrier layer and the Cu electrical interconnection film.

Means for the Solution of the Problems

The inventors of this invention have found that the foregoing object of the present invention can be achieved through the use, as an adhesive layer, of a film consisting of Co which is less expensive as compared with Ru, in order to ensure the adhesion between a CVD-Cu film or a PVD-Cu film and a barrier film and have thus completed the present invention.

Accordingly, the Cu electrical interconnection film-forming method of the present invention comprises the steps of forming, on a substrate provided thereon with holes or trenches, a barrier film composed of a member selected from the group consisting of Ti, TiN, Ta, TaN, W, WN and silicide; forming a PVD-Co film, a CVD-Co film or an ALD-Co film on the barrier film thus formed; filling up or burying the holes or trenches, the surface of which is covered with the Co film, with a CVD-Cu film or a PVD-Cu film; and then heat-treating the substrate provided thereon with the foregoing films thus formed at a temperature of not higher than 350° C. to thus form a Cu electrical interconnection film.

If using a Co film as an adhesive layer for a Cu electrical interconnection film, the adhesion between the Cu electrical interconnection film and the Co film is highly improved and therefore, the resulting Cu electrical interconnection film is completely free of any void and the resulting product having the electrical interconnection film would have improved electrical interconnection reliability such as the resistance to SM (Stress Migration) and the resistance to EM (Electro-Migration). In addition, if filling up or burying the holes or the like with the Cu film and then heat treating the substrate carrying the Cu film at a predetermined temperature of not higher than 350° C. for a desired period of time, the adhesion between the Cu electrical interconnection film and the Co film is quite conspicuously improved and accordingly, the electrical interconnection reliability of the resulting product such as the resistance to SM and the resistance to EM would further be improved.

According to another aspect of the present invention, there is also provided a Cu electrical interconnection film-forming method which comprises the steps of forming, on a substrate provided thereon with holes or trenches, a barrier film composed of a member selected from the group consisting of Ti, TiN, Ta, TaN, W, WN and silicide; forming a PVD-Co film, a CVD-Co film or an ALD-Co film on the barrier film thus formed; forming a CVD-Cu film or a PVD-Cu film, as a seed film, on the Co film; filling up or burying the holes or trenches, the surface of which is covered with the seed film, with a Cu film according to the plating technique; and then heat-treating the resulting substrate provided thereon with the foregoing films thus formed at a temperature of not higher than 350° C. to thus form a Cu electrical interconnection film.

In this case, if likewise using a Co film as an adhesive layer for a Cu electrical interconnection film, the adhesion between the Cu electrical interconnection film and the Co film is considerably improved and therefore, the resulting Cu electrical interconnection film is completely free of any void and the resulting electrical interconnection film-carrying substrate (eventually, the device) would have improved electrical interconnection reliability such as the resistance to SM and the resistance to EM. In addition, if filling up or burying the holes or the like with the Cu film and then heat-treating the resulting substrate at a predetermined temperature of not higher than 350° C. for a desired period of time, the adhesion between the Cu electrical interconnection film and the Co film is quite conspicuously improved and accordingly, the electrical interconnection reliability of the resulting substrate (eventually, the device) product such as the resistance to SM and the resistance to EM would further be improved.

In the foregoing Cu electrical interconnection film-forming method, preferably used herein as the barrier film is a W film or a TiN film.

According to a further aspect of the present invention, the Cu electrical interconnection film-forming method comprises the steps of forming a W-barrier film or a TiN-barrier film on a substrate provided thereon with holes or trenches; exposing the substrate to the atmosphere; thereafter forming a PVD-Co film, a CVD-Co film or an ALD-Co film on the TiN-barrier film; after exposing the substrate to the atmosphere or without exposing it to the atmosphere, filling up or burying the holes or trenches, the surface of which is covered with the Co film, with a CVD-Cu film or a PVD-Cu film; and then heat-treating the resulting substrate provided thereon with the foregoing films thus formed at a temperature of not higher than 350° C. to thus form a Cu electrical interconnection film.

According to a still further aspect of the present invention, the Cu electrical interconnection film-forming method comprises the steps of forming a W-barrier film or a TiN-barrier film on a substrate provided thereon with holes or trenches; exposing the substrate to the atmosphere; thereafter forming a PVD-Co film, a CVD-Co film or an ALD-Co film on the TiN-barrier film; after exposing the substrate to the atmosphere or without exposing it to the atmosphere, forming a CVD-Cu film or a PVD-Cu film, as a seed film, on the Co film; filling up or burying the holes or trenches, the surface of which is covered with the seed film, with a Cu film according to the plating technique; and then heat-treating the resulting substrate provided thereon with the foregoing films thus formed at a temperature of not higher than 350° C. to thus form a Cu electrical interconnection film.

In the foregoing Cu electrical interconnection film-forming method of the present invention, it is preferred that the heat-treatment is carried out at a temperature ranging from 250 to 350° C., and more preferably 250 to 300° C., over a predetermined period of time. This is because, if the temperature of the heat-treatment is less than 250° C. problems arise such that the resulting electrical interconnection film has insufficiently low adhesion and that this correspondingly results in the sucking up of Cu.

Effects of the Invention

The present invention uses a laminate film composed of a Co film and a barrier film, as a base layer and therefore, the adhesion between the Cu electrical interconnection film and the base layer becomes quite excellent. For this reason, the present invention would permit the achievement of such an effect that the resulting Cu electrical interconnection film is completely free of any void and that the resulting electrical interconnection film would have thus improved electrical interconnection reliability such as high resistance to SM and high resistance to EM.

BRIEF DESCRIPTION OF THE DRAWINGS

FIGS. 1(a) and 1(b) illustrate the generation of voids in holes due to the overhang observed at the upper portion of each hole and FIGS. 1(c) and 1(d) illustrate the generation of voids due to the unsymmetrical properties of a barrier film formed on the side wall of each hole.

FIG. 6(a) is a schematic cross sectional view of the wafer, while FIG. 6(b) is an SEM micrograph of the cross section.

MODE FOR CARRYING OUT THE INVENTION

In a preferred embodiment of the Cu electrical interconnection film-forming method according to the present invention, the Cu electrical interconnection film is obtained by forming, on a substrate having holes or trenches formed thereon, a barrier film composed of a member selected from the group consisting of Ti, TiN, Ta, TaN, W, WN and silicide, in a predetermined thickness, according to the known method, forming a PVD-Co film, a CVD-Co film or an ALD-Co film on the barrier film, in a desired thickness, according to the known process conditions, filling up or burying the holes or trenches, the surface of which is covered with the Co film, with a CVD-Cu film or a PVD-Cu film according to the known process conditions; or forming, under the known process conditions, a CVD-Cu film or a PVD-Cu film having a desired thickness and serving as a seed film, on a PVD-Co film, a CVD-Co film or an ALD-Co film formed according to the procedures described above, filling up or burying the holes or trenches, the surface of which is covered with the seed film, with a Cu film formed according to the plating technique under the known process conditions; and then heat-treating the resulting assembly at a temperature of not higher than 350° C., preferably 250 to 350° C. and more preferably 250 to 300° C., for a predetermined period of time.

There have long been used, for instance, a Ti film and a TiN film as barrier films (adhesive films) for Cu electrical interconnection films in the field of, for instance, the leading-edge or advanced devices (such as flash memory), but the inventors of this invention have found that the Co film is superior to the Ti film and the TiN film in the adhesion to the Cu electrical interconnection film.

Figure 2:
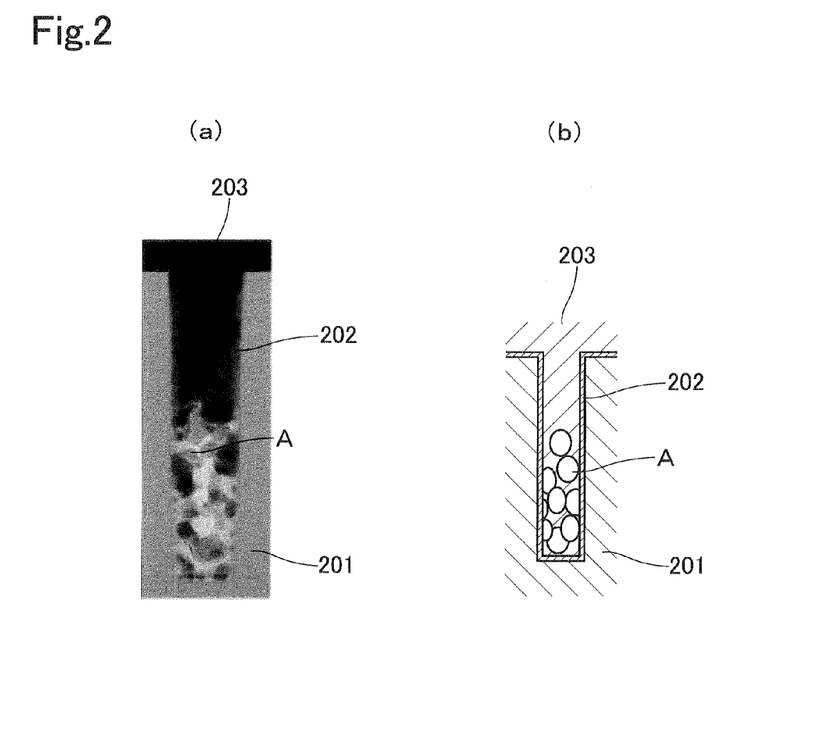
FIGS. 2(a) and 2(b) are an SEM micrograph and a schematic diagram thereof, respectively, each illustrating the generation of a void in a hole, in the case of the conventional technique.

As has been shown in FIG. 2 described above, when forming a conventional ALD-TiN barrier film which cannot serve as an appropriate adhesive film and then filling up or burying holes or trenches with a CVD-Cu film, a large number of voids are detected within the holes in the case of, for instance, holes having a diameter ($\phi$) of 100 nm. This would be because apart of the Cu film is peeled off from the underlying barrier film and undergoes cohesion due to the insufficient adhesion between the CVD-Cu film and the ALD-TiN barrier film. On the other hand, when sandwiching a PVD-Co film, a CVD-Co film or an ALD-Co film serving as an adhesive layer, between an ALD-TiN barrier film and a CVD-Cu electrical interconnection film, the Cu film never gives rise to any phenomenon of cohesion, the resulting Cu film is completely free of any void and accordingly, the interior of the hole can closely and compactly be filled up or buried with the Cu film (as will be detailed below, see FIG. 5).

Figure 3:
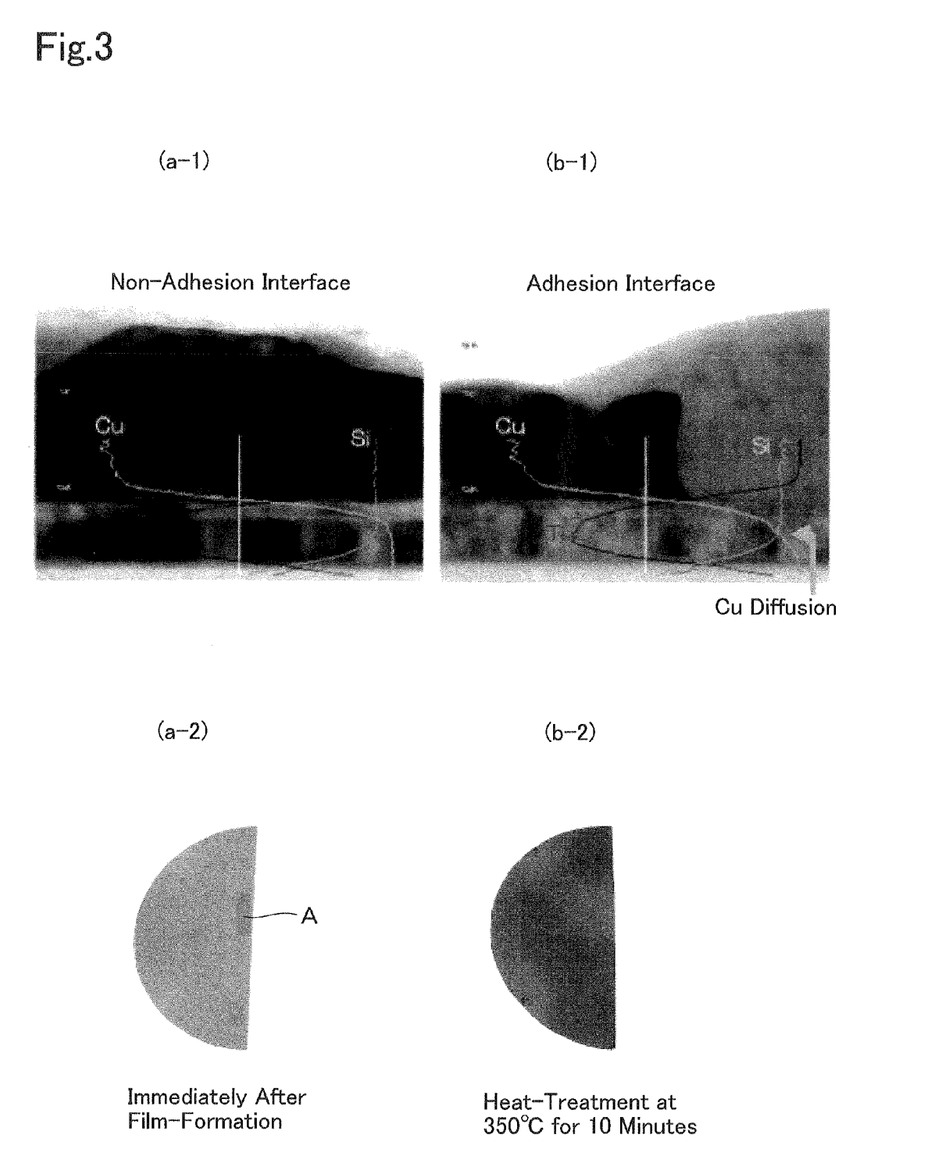
FIG. 3 shows a TEM micrograph of the substrate's cross section, the results obtained by the EDX analysis and the results obtained by the tape test, observed when forming Cu electrical interconnection films according to the conventional technique and more specifically, FIGS. 3(a-1) and 3(a-2) are those observed immediately after the film-formation, while FIGS. 3(b-1) and 3(b-2) are those observed after the film-formation and the heat-treatment thereof.

FIGS. 3(a-1) and 3(b-1) each show a TEM micrograph of the substrate's cross section used for examining the conditions of the interface existing and formed between a Ti film and a Cu film immediately after the film-formation (FIG. 3(a-1)) and after the film-formation and the subsequent heat-treatment at 350° C. for 10 minutes (FIG. 3(b-1)). In this respect, the Ti film is formed, in a thickness of 15 nm, on the oxide film ($SiO_2$ film) of 100 nm thick formed on a substrate of 300 mm$\phi$, according to the PVD technique under the known process conditions, and then the Cu film (CVD-Cu film) is applied, in a thickness of 1000 nm, onto the Ti film under the known process conditions. There is observed the presence of an interfacial layer having a thickness of about 5 nm between the Ti film and the Cu film, immediately after the film-formation. When analyzing the resulting product provided thereon with the foregoing films according to the EDX analysis, it was found that this interfacial layer contained oxygen. On the other hand, it was found that the presence of any interfacial layer was not detected within the region existing between the Ti film and the Cu film when examining the product after the film-formation and the heat-treatment carried out at 350° C. for 10 minutes and that, as a result of the EDX analysis thereof, the interfacial layer contained almost no oxygen unlike the interfacial layer free of any heat-treatment.

To inspect the substrates formed according to the foregoing procedures and each provided thereon with a Ti film and a Cu film for the adhesion between these films, they were subjected to the known tape test. The results thus obtained are plotted on FIGS. 3(a-2) and 3(b-2), respectively. These results clearly indicate that in the case of the substrate shown in FIG. 3(a-1), the Cu film is peeled off (see, for instance, the portion indicated by A in the figure). It would be believed that the interfacial layer between the Ti film and the Cu film may cause the deterioration of the adhesion between the Ti film and the Cu film. Contrary to this, any interfacial layer is not observed between these films in the case of the substrate shown in FIG. 3(b-1) because of the heat-treatment carried out at 350° C. This would be because an alloy is formed between Cu and Ti through the diffusion of Cu into the Ti film due to the heat-treatment and this would be supported by the results obtained in the Auger electron spectroscopic analysis thereof. The adhesion of the Cu film to the Ti barrier film certainly increases in such a condition and therefore, the Cu film never undergoes any exfoliation from the barrier film even in the foregoing tape test (see FIG. 3(b-2)).

Figure 4:
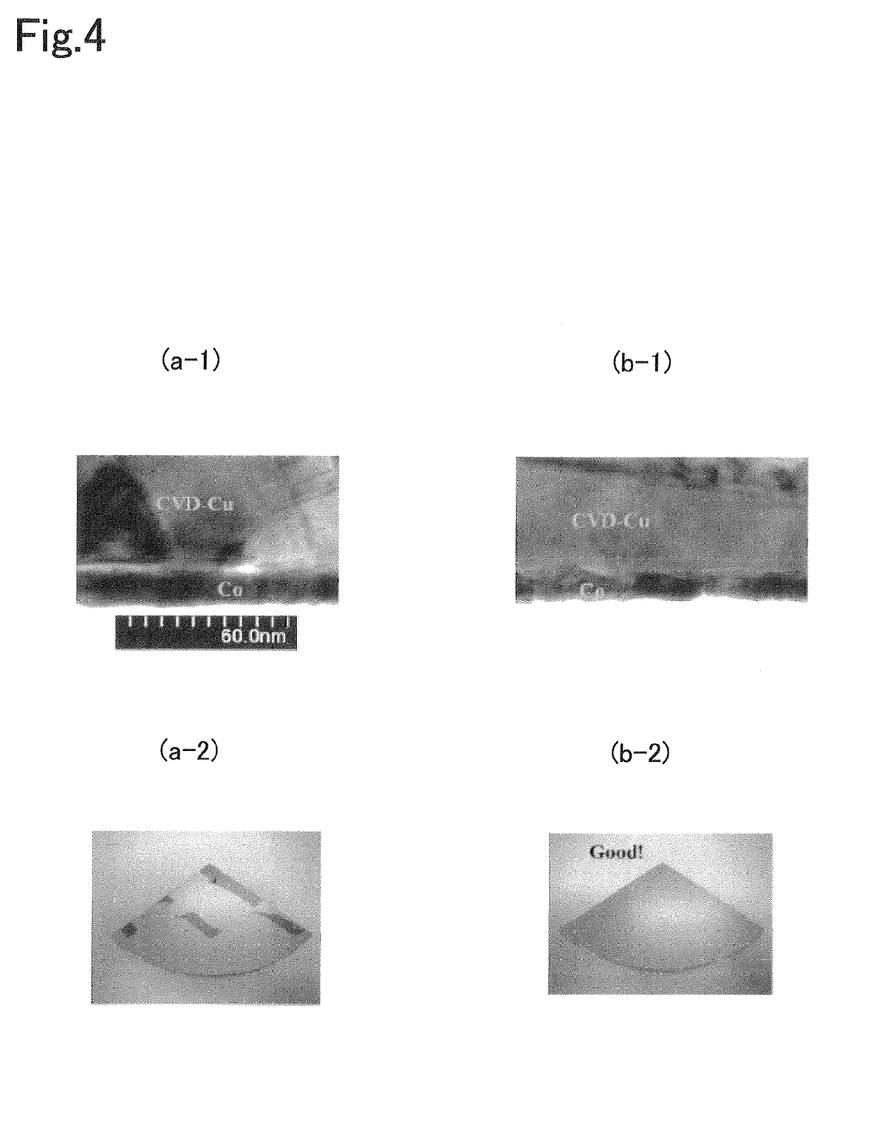
FIG. 4 shows a TEM micrograph of the substrate's cross section and the results obtained by the tape test, observed when forming Cu electrical interconnection films according to the present invention and more particularly, FIGS. 4(a-1) and 4(a-2) are those observed immediately after the film-formation, while FIGS. 4(b-1) and 4(b-2) are those observed after the film-formation and the heat-treatment thereof.

According to the same procedures described above, a Co film of 15 nm thick was formed on the oxide film ($SiO_2$ film) of 100 nm thick formed on a substrate of 300 mm$\phi$, by the PVD technique under the known process conditions, a CVD- Cu film was applied, in a thickness of 1000 nm, onto the Co film under the known process conditions and then the substrate provided thereon with the foregoing films was heat-treated at 250° C. for 10 minutes. In this case, TEM micrographs illustrating the cross section of the interface between the Co film and the Cu film, which are observed immediately after the film-formation and after the film-formation and the subsequent heat-treatment are shown in FIGS. 4(*a*-1) and 4(*b*-1), respectively. In addition, the results obtained in the tape test thereof are also shown in FIGS. 4(*a*-2) and 4(*b*-2), respectively. In the case of the Co film, an interfacial layer is observed between the Co film and the Cu film as in the case of the Ti film, but the thickness of the Co film is on the order of 2.6 nm which is about ½ time that of the Ti film. Then the Cu film was subjected to a tape test. The results thus obtained indicate that the Cu film undergoes exfoliation. On the other hand, when heat-treating the substrate carrying these films thereon at 250° C. for 10 minutes, any interfacial layer is not detected between the Co and Cu films due to the mutual diffusion of Cu and Co and the formation of an alloy between them. For this reason, any exfoliation of the Cu film is not detected at all in the tape test thereof. Thus, the Cu electrical interconnection film formed after the heat-treatment at 250° C. for 10 minutes has quite excellent adhesion between the Cu electrical interconnection film and the Co film and accordingly, any void is not formed within the Cu electrical interconnection film and the resulting Cu electrical interconnections would have highly improved reliability of electrical interconnection such as the resistance to SM and EM.

As will be clear from the foregoing, the thickness of the interfacial layer formed between the Co film and the Cu film is thin as compared with that of the interfacial layer formed between the Ti film and the Cu film (about half of the latter) and as a result, there is such a merit that the desired adhesion therebetween can be ensured even when using a heat-treatment temperature on the order of 250° C. which is lower than the temperature on the order of 350° C. used in the case of the Ti film. The reason why the thickness of the interfacial layer is reduced would be due to such a peculiarity of Co that Co is hardly oxidizable as compared with Ti. Further it would likewise be assumed that the Co film surely has high corrosion resistance even to elements of halogen such as fluorine and chlorine as a result of this quite low oxidizability of Co. These characteristic properties thereof are quite advantageous in the cases which make use of CVD-Cu raw materials containing impurities such as O, F, C and Cl.

Figure 5:
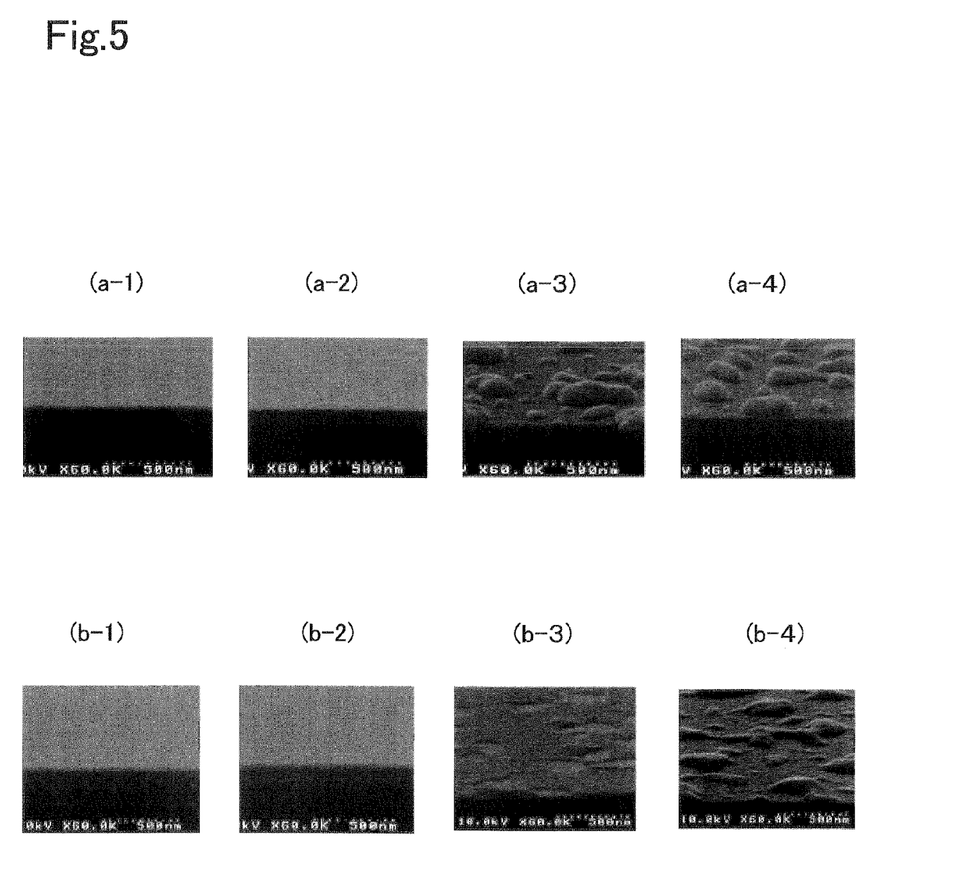
FIG. 5 shows SEM micrographs of the substrate's surface observed when forming Cu electrical interconnection films according to the conventional technique and the present invention, respectively and more specifically, FIGS. 5(a-1) to 5(a-4) are those observed for the Cu electrical interconnection films formed according to the conventional technique, while FIGS. 5(b-1) and 5(b-4) are those observed for the same films formed according to the present invention.

FIG. 5 shows SEM micrographs of the surface of a Cu film obtained by forming a CVD-Cu film having a thickness of 10 nm on a substrate provided thereon with a PVD-Ti film and a PVD-Co film, according to the known process conditions and then heat-treating the substrate at a predetermined temperature for a desired period of time.

FIGS. 5(*a*-1) to 5(*a*-4) show several SEM micrographs each taken at a desired angle from the surface of a Cu film. More specifically, the SEM micrograph shown in FIG. 5(*a*-1) is one observed immediately after the Cu film-formation, when a PVD-Ti film having a thickness of 15 nm, as a base film, is formed on a substrate and then a PVD-Cu film of 10 nm thick is formed thereon without carrying out any vacuum-braking (release of vacuum); the SEM micrograph shown in FIG. 5(*a*-2) is one observed after the formation of a Ti film, the subsequent formation of a Cu film without braking the vacuum (release of vacuum) and the subsequent heat-treatment of these applied films at 400° C. for one hour; the SEM micrograph shown in FIG. 5(*a*-3) is one observed when forming a Ti film, exposing the film to the atmosphere, forming a Cu film and then heat-treating the films thus formed at 300° C. for one hour; and the SEM micrograph shown in FIG. 5(*a*-4) is one observed when forming a Ti film, exposing the film to the atmosphere, forming a Cu film and then heat-treating the films thus formed at 400° C. for one hour.

In addition, FIGS. 5(*b*-1) to 5(*b*-4) show several SEM micrographs each taken at a desired angle from the surface of a Cu film. More specifically, the SEM micrograph shown in FIG. 5(*b*-1) is one observed immediately after the Cu film-formation, when a PVD-Co film having a thickness of 15 nm, as a base film, is formed on a substrate and then a PVD-Cu film of 10 nm thick is formed thereon without carrying out any vacuum-braking (release of vacuum); the SEM micrograph shown in FIG. 5(*b*-2) is one observed when a Co film is formed, a Cu film is subsequently formed without braking the vacuum (release of vacuum) and then these applied films are subsequently heat-treated at 400° C. for one hour; the SEM micrograph shown in FIG. 5(*b*-3) is one observed when a Co film is formed, the film is exposed to the atmosphere, a Cu film is formed and then the films thus formed are heat-treated at 300° C. for one hour; and the SEM micrograph shown in FIG. 5(*b*-4) is one observed when forming a Co film, exposing the film to the atmosphere, forming a Cu film and then heat-treating the films thus formed at 400° C. for one hour.

In this respect, if the adhesion between the base film and the Cu film is insufficient, the Cu film undergoes exfoliation and cohesion due to the action of the surface tension.

As will be clear from the results shown in FIGS. 5(*a*-1) to 5(*a*-2) and FIGS. 5(*b*-1) to 5(*b*-2), the both Ti film and Co film never entrain any cohesion of the Cu film formed thereon when the Cu film is formed without braking the vacuum after the formation of the both Ti and Co films and when the Cu film is heat-treated at 400° C. after the formation thereof (in other words, the adhesion between each of the Ti and Co films and the Cu film is excellent).

On the other hand, when the Ti film and Co film are exposed to the atmosphere after the formation thereof, a Cu film is then formed and subsequently these films are subjected to a heat-treatment, the adhesion between the Cu film and the Ti film is different from that observed between the Cu film and the Co film. As will be seen from FIGS. 5(*a*-3) to 5(*a*-4) and 5(*b*-3) to 5(*b*-4), there is observed, in the case of the Ti film, significant cohesion of the Cu film at heat-treatment temperatures of 300° C. and 400° C., while there is only slightly observed the cohesion of the Cu film at a heat-treatment temperature of 300° C., in the case where the Co film is used and the Cu film does not undergo any complete cohesion in the latter case even at a temperature of 400° C. From the foregoing, it would be assumed that the adhesion between the Cu film and the Ti film is deteriorated in the case where the Ti film is used, because of the formation of an oxide through the oxidation of the surface of the Ti film during the exposure thereof to the atmosphere, but the adhesion between the Cu film and the Co film is excellent in the case where the Co film is used as an adhesive film, since the oxidation of the Co film does not proceed and the surface of the film maintains its characteristics as a metal film. Therefore, in the case where a base film composed of a Co film is used, the temperature of the heat-treatment is not higher than 350° C. and preferably not higher than 300° C. In this respect, the lower limit thereof would be predicted to be 250° C. in the light of the result as shown in FIG. 4.

As has been discussed above, a laminate film composed of a Co film and a barrier film can be used as a base film in the present invention. Usable herein as the barrier film to be arranged below the Co film may be one formed from a member selected from the group consisting of Ti, TiN, Ta, TaN, W, WN and silicide and the barrier film is desirably formed uniformly within microscopic holes or trenches. For this reason, more preferably used herein are W and TiN films formed according to the ALD and CVD techniques since these films can symmetrically and uniformly be formed on the wall of such holes and they are hardly cause any overhanging during the film-forming operations. Most preferably used herein is the TiN film.

In the present invention, the substrates are not restricted to particular ones inasmuch as they can be used in the production of semiconductor devices.

Example 1

Figure 6:
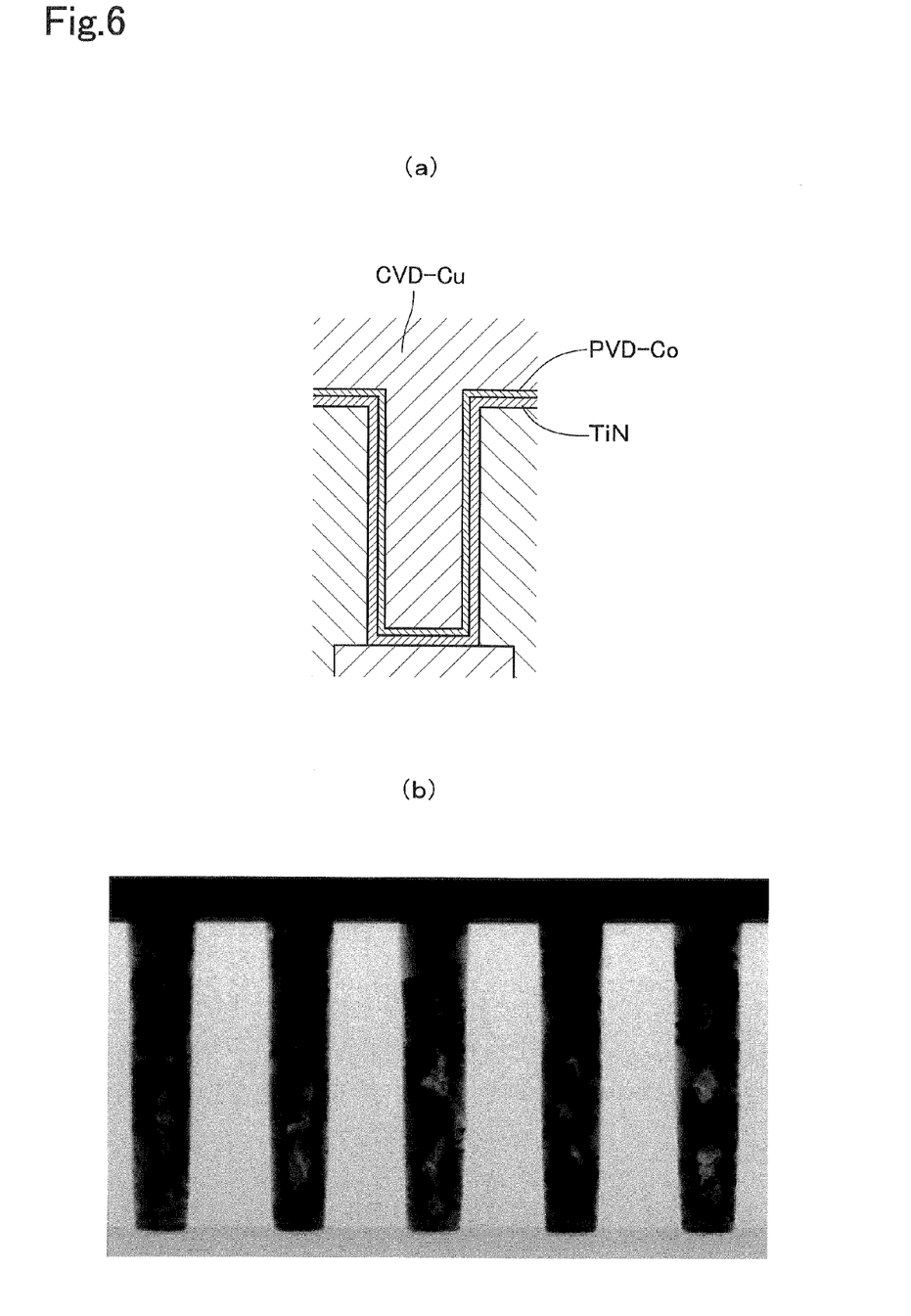
FIG. 6 is a diagram showing the cross section of a wafer observed when a Cu electrical interconnection film is formed according to the procedures used in Example 1 and more particularly.

A Cu electrical interconnection film was formed using, as a substrate, a wafer of 300 mm$\phi$ having a desired pattern of holes each having a diameter ($\phi$) of 100 nm and an aspect ratio (AR) of 5. As schematically shown in FIG. 6(a), a TiN barrier film having a thickness of 3 nm was first formed on the wafer according to the Cat-ALD technique (raw material: $TiCl_4$; film-forming temperature: 350° C.; film-forming pressure: several pascals (Pa) to several tens of Pa). The wafer was exposed to the atmosphere after the formation of the ALD-TiN barrier film, subsequently a Co film of 5 nm thick was formed on the barrier film according to the PVD technique (film-forming temperature: 25° C.; and film-forming pressure: 0.5 Pa), the wafer was again exposed to the atmosphere and then a Cu film of 100 nm thick was formed according to the CVD technique (film-forming temperature: 200° C.; and film-forming pressure: 500 Pa). Thereafter, the wafer was heat-treated at a temperature of 250° C. for one hour. As a result, as will be clear from a SEM micrograph shown in FIG. 6(b), it was found that any void was not formed within the resulting Cu film and the holes were closely and compactly filled up or buried with the CVD-Cu film.

In addition, even when the Cu film was formed according to the PVD technique (film-forming temperature: −20° C.; and film-forming pressure: 0.5 Pa) and when the heat-treatment after the Cu film formation was carried out at a temperature of 200° C. or 300° C. for one hour, it was also found that any void was not formed within the resulting Cu film and the holes were closely and compactly filled up or buried with the CVD-Cu film, as in the case described above.

Furthermore, even when after the formation of the foregoing Co film, a CVD-Cu film was continuously formed without releasing the vacuum and without exposing the wafer to the atmosphere, it was likewise found that any void was not formed within the resulting Cu film and the holes were closely and compactly filled up or buried with the CVD-Cu film, as in the case described above.

Example 2

The same method used in Example 1 was repeated except that the Co film was prepared according to the CVD technique (film-forming pressure: 150 Pa; and film-forming temperature: 270° C.) using $Co(CH_3C_5H_4)_2$ as a Co-containing raw material, in place of the PVD technique used in Example 1. As a result, it was found that excellent hole-filling up or -burying properties were also observed even when a CVD-Co film was used as an adhesive layer, as in the case of Example 1.

INDUSTRIAL APPLICABILITY

According to the present invention, in the semiconductor device-manufacturing process, the use of a laminate film composed of a Co film and a barrier film as a base film would permit the substantial improvement of the adhesion between a Cu electrical interconnection film and the base film and this in turn results in the formation of an extremely excellent Cu electrical interconnection film free of any void and the improvement of the electrical interconnection-reliability such as the resistance to SM and the resistance to EM. Therefore, the present invention can be applied to the industrial fields such as the semiconductor device-manufacturing field.

BRIEF DESCRIPTION OF SYMBOLS

101 . . . Substrate; 102 . . . Barrier Film; 103 . . . PVD-Seed Film; 104 . . . Cu Film; 201 . . . Substrate; 202 . . . TiN Barrier Film; 203 . . . CVD-Cu Film.

What is claimed is:

1. A Cu electrical interconnection film-forming method comprising the steps of:
    forming, on a substrate provided thereon with holes or trenches, a barrier film composed of a member selected from the group consisting of Ti, TiN, Ta, TaN, W, WN and silicide;
    forming an adhesive layer of a PVD-Co metal film, a CVD-Co metal film or an ALD-Co metal film on the barrier film thus formed;
    filling up or burying the holes or trenches, the surface of which is covered with the Co film, with a CVD-Cu film or a PVD-Cu film; and
    heat-treating the resulting substrate provided thereon with the foregoing films thus formed at a temperature of not higher than 350° C. to thus form a Cu electrical interconnection film.

2. The Cu electrical interconnection film-forming method as set forth in claim 1, wherein the barrier film is a W film or a TiN film.

3. The Cu electrical interconnection film-forming method as set forth in claim 1, wherein the heat-treatment is carried out at a temperature ranging from 250 to 350° C.

4. A Cu electrical interconnection film-forming method comprising the steps of:
    forming, on a substrate provided thereon with holes or trenches, a barrier film composed of a member selected from the group consisting of Ti, TiN, Ta, TaN, W, WN and silicide;
    forming an adhesive layer of a PVD-Co metal film, a CVD-Co metal film or an ALD-Co metal film on the barrier film thus formed;
    forming a CVD-Cu film or a PVD-Cu film, as a seed film, on the Co film;
    filling up or burying the holes or trenches, the surface of which is covered with the seed film, with a Cu film according to the plating technique; and
    heat-treating the resulting substrate provided thereon with the foregoing films thus formed at a temperature of not higher than 350° C. to thus form a Cu electrical interconnection film.

5. The Cu electrical interconnection film-forming method as set forth in claim 4, wherein the barrier film is a W film or a TIN film.

6. The Cu electrical interconnection film-forming method as set forth in claim 4, wherein the heat-treatment is carried out at a temperature ranging from 250 to 350° C.

7. A Cu electrical interconnection film-forming method comprising the steps of:
    forming a W-barrier film or a TiN-barrier film on a substrate provided thereon with holes or trenches;
    exposing the substrate to the atmosphere;

forming an adhesive layer of a PVD-Co metal film, a CVD-Co metal film or an ALD-Co metal film on the W-barrier film or TiN-barrier film;

after exposing the substrate to the atmosphere or without exposing it to the atmosphere, filling up or burying the holes or trenches, the surface of which is covered with the Co film, with a CVD-Cu film or a PVD-Cu film; and heat-treating the resulting substrate provided thereon with the foregoing films thus formed at a temperature of not higher than 350° C. to thus form a Cu electrical interconnection film.

8. The Cu electrical interconnection film-forming method as set forth in claim 7, wherein the heat-treatment is carried out at a temperature ranging from 250 to 350'C.

9. A Cu electrical interconnection film-forming method comprising the steps of:

forming a W-barrier film or a TiN-barrier film on a substrate provided thereon with holes or trenches;

exposing the substrate to the atmosphere;

forming an adhesive layer of a PVD-Co metal, a CVD-Co metal film or an ALD-Co metal film on the W-barrier film or TiN-barrier film;

after exposing the substrate to the atmosphere or without exposing it to the atmosphere, forming a CVD-Cu film or a PVD-Cu film, as a seed film, on the Co film;

filling up or burying the holes or trenches, the surface of which is covered with the seed film, with a Cu film according to the plating technique; and heat-treating the resulting substrate provided thereon with the foregoing films thus formed at a temperature of not higher than 350° C. to thus form a Cu electrical interconnection film.

10. The Cu electrical interconnection film-forming method as set forth in claim 9, wherein the heat-treatment is carried out at a temperature ranging from 250 to 350° C.

* * * * *